(12) United States Patent
Clark, Jr. et al.

(10) Patent No.: US 9,337,088 B2
(45) Date of Patent: May 10, 2016

(54) MOL RESISTOR WITH METAL GRID HEAT SHIELD

(71) Applicant: International Business Machines Corporation, Armonk, NY (US)

(72) Inventors: William F. Clark, Jr., Essex Junction, VT (US); Robert R. Robison, Colchester, VT (US); Hung H. Tran, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/302,757

(22) Filed: Jun. 12, 2014

(65) Prior Publication Data

US 2015/0364398 A1    Dec. 17, 2015

(51) Int. Cl.
*H01L 21/768* (2006.01)
*H01L 49/02* (2006.01)
*H01L 23/367* (2006.01)
*H01L 23/522* (2006.01)

(52) U.S. Cl.
CPC ...... *H01L 21/76877* (2013.01); *H01L 23/3677* (2013.01); *H01L 23/5225* (2013.01); *H01L 23/5228* (2013.01); *H01L 28/20* (2013.01)

(58) Field of Classification Search
CPC ............ H01L 27/0629; H01L 27/0727; H01L 27/0738; H01L 27/0802; H01L 28/20; H01L 23/522; H01L 23/5226; H01L 23/5228
See application file for complete search history.

(56) References Cited

U.S. PATENT DOCUMENTS

| | | | |
|---|---|---|---|
| 4,951,118 A | 8/1990 | Nakamura | |
| 6,940,720 B2 | 9/2005 | Fischer et al. | |
| 7,042,331 B2 | 5/2006 | Zhou et al. | |
| 7,345,364 B2 | 3/2008 | Kerr et al. | |
| 7,375,000 B2 | 5/2008 | Nowak et al. | |
| 2007/0069334 A1* | 3/2007 | Beach | H01L 23/5228 257/536 |
| 2007/0284662 A1 | 12/2007 | Chinthakindi et al. | |
| 2012/0002375 A1 | 1/2012 | Lin et al. | |
| 2012/0146186 A1* | 6/2012 | Lukaitis et al. | 257/536 |
| 2012/0181663 A1* | 7/2012 | Lukaitis et al. | 257/536 |
| 2013/0270678 A1 | 10/2013 | Rankin et al. | |

OTHER PUBLICATIONS

"Method and System of Cooling RX/Poly Resistors using a Body-Tie Structure and a Metal Interconnect Mesh", An IP.com Prior Art Database Technical Disclosure, IP.com No. IPCOM000197768D, IP.com Electronic Publication: Jul. 21, 2010, pp. 1-2.

* cited by examiner

*Primary Examiner* — Bryan Junge
(74) *Attorney, Agent, or Firm* — Steven J. Meyers; Hoffman Warnick LLC

(57) ABSTRACT

An semiconductor structure, method of fabrication therefor, and design structure therefor is provided. A thermal grid is formed over at least a portion of a substrate. An insulating layer is formed over at least a portion of the thermal grid. A resistor is formed over at least a portion of the insulating layer. A buried interconnect is connected to the thermal grid via at least one contact. The buried interconnect is adapted to receive thermal energy from the thermal grid via the at least one contact.

18 Claims, 15 Drawing Sheets

US 9,337,088 B2

MOL RESISTOR WITH METAL GRID HEAT SHIELD

BACKGROUND OF THE INVENTION

The present invention relates generally to the field of semiconductor structures, and more particularly to a semiconductor structure having a metal grid heat shield.

Semiconductor structure fabrication commonly includes the use of components such as resistors, which may be used by designers to increase the performance, functionality, and efficiency of semiconductor structures. However, during operation, the use of resistors may generate heat which is dispersed throughout the semiconductor structure and to other components included therein. This heat may collect within the semiconductor structure, elevating temperatures of the other components and portions of the semiconductor structure itself. These elevated temperatures may damage and/or limit the efficiency, longevity, and effectiveness of the other components and even the semiconductor structure itself. The limitations imposed by these resultant heated portions may influence and limit semiconductor structure design and performance, causing designers to, for example, limit resistor size and current carrying capacity in order to mitigate the effects of the heating. These reductions in resistor size and current carrying capacity may limit semiconductor structure versatility and performance.

SUMMARY

According to one embodiment of the present invention, a semiconductor structure is provided. The semiconductor structure may include a thermal grid over at least a portion of a substrate. The semiconductor structure may also include a first insulating layer over at least a portion of the thermal grid. The semiconductor structure may also include a resistor over at least a portion of the first insulating layer. The semiconductor structure may also include a buried interconnected that is connected to the thermal grid by at least one contact. The buried interconnect is adapted to receive thermal energy from the thermal grid via the at least one contact.

According to another embodiment, a method for fabricating a semiconductor structure is provided. The method may include forming a thermal grid over at least a portion of a substrate. The method may also include forming a buried interconnect at least partially within the substrate. The buried interconnect is adapted to receive thermal energy from the thermal grid via at least one contact. The method may also include forming a first insulating layer over at least a portion of the thermal grid and the buried interconnect. The method may also include forming a resistor over at least a portion of the first insulating layer.

Figure 1:
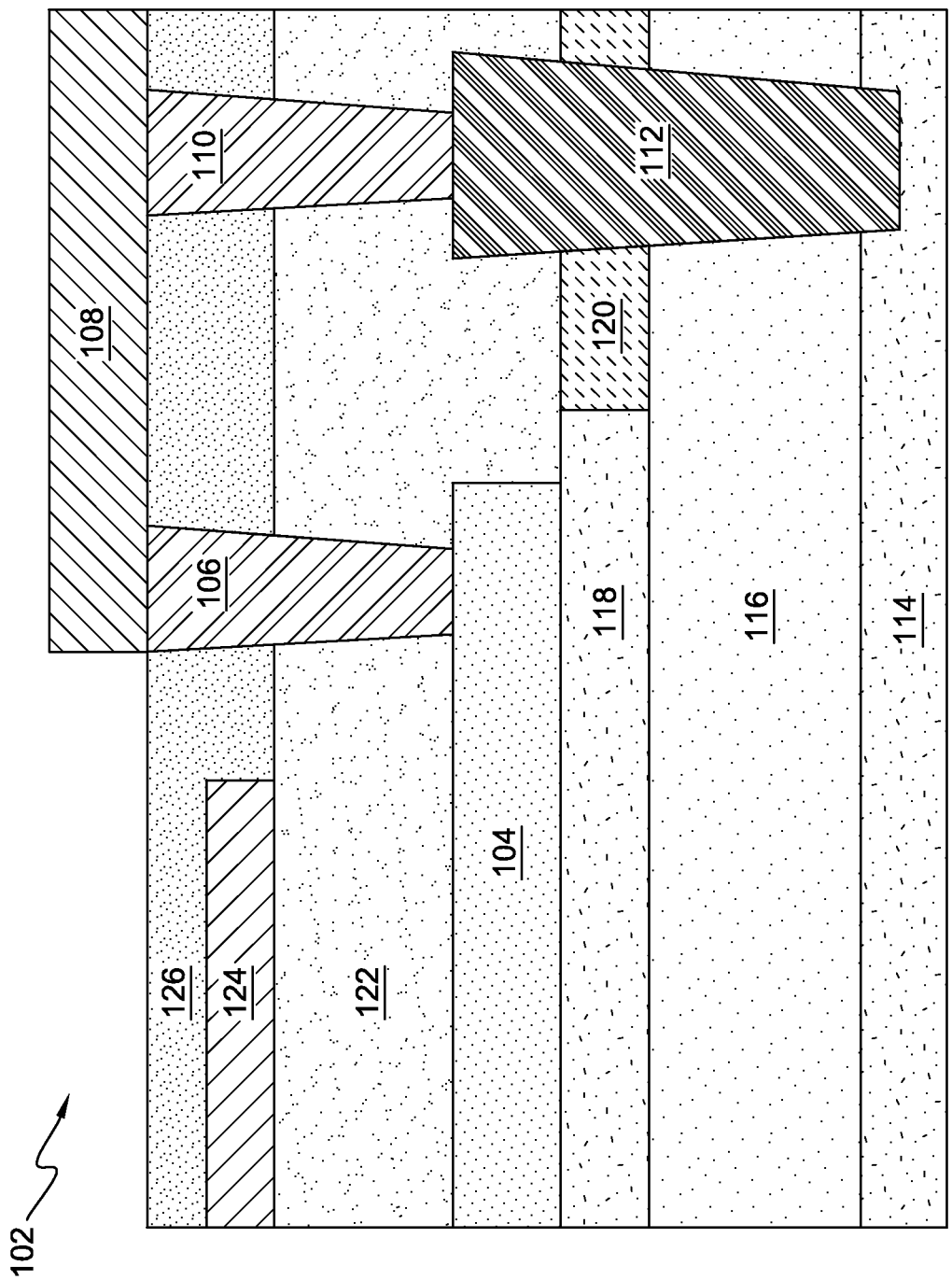
FIG. 1 depicts a cross-sectional side view of portions of a semiconductor structure of FIG. 15, along view line A-A, in accordance with an embodiment of the present disclosure.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

Detailed embodiments of the claimed structures and methods are disclosed herein. The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments. The Figures represent cross-section portions of a semiconductor chip or a substrate during fabrication and are not drawn to scale, but instead are drawn to illustrate the features of the described embodiments. Specific structural and functional details disclosed herein are not to be interpreted as limiting but merely as a representative basis for teaching one skilled in the art to variously employ the methods and structures of the present disclosure.

For purposes of the description hereinafter, the terms "upper", "lower", "right", "left", "vertical", "horizontal", "top", "bottom", and derivatives thereof shall relate to the disclosed structures and methods, as oriented in the drawing Figures. The terms "overlying", "atop", "over", "on", "positioned on", or "positioned atop" mean that a first element is present on a second element wherein intervening elements, such as an interface structure, may be present between the first element and the second element. The term "direct contact" means that a first element and a second element are connected without any intermediary conducting, insulating, or semiconductor layers at the interface of the two elements.

Embodiments of the present invention provide a semiconductor structure and method. In an embodiment, the semiconductor structure includes a thermally conductive grid disposed between a semiconductor substrate and a semiconductor device, such as a resistor. Other embodiments provide a pathway for the flow of thermal energy (heat) from the thermally conductive grid to the substrate by way of an interconnect buried within. The grid is thermally connected to the buried interconnect by a grid contact, a wiring layer, and a buried interconnect contact.

FIG. 1 depicts a cross-sectional view of a portion of a semiconductor structure 102 including heat shielding by a thermal grid 104 of thermally conductive material (e.g., metal gates). Semiconductor structure 102 includes a substrate 114 (e.g., wafer) upon which a series of fabrication processes (e.g., silicon on insulator processes) may be performed, including deposition of an insulation layer 118 and forming of a resistor 124. In one embodiment, a thermal grid 104 may be formed as part of the series of fabrication processes. Thermal grid 104 may be located proximate to resistor 124 and may dissipate thermal energy (e.g., heat) from resistor 124. In one embodiment, thermal grid 104 may be formed adjacent resistor 124, thereby enabling thermal energy to flow from resistor 124 to thermal grid 104. Thermal grid 104 may be electrically grounded (e.g., electrically neutral) and may include metal, oxide, or other conductive materials or combination of materials. A buried interconnect (BI) 112 may be connected to thermal grid 104 via a grid contact 106, a wiring layer 108, and a BI contact 110. BI 112 may be formed in and/or through a shallow trench isolation structure (STI) 120, and a contact layer 122. Grid contact 106 and BI contact 110 may be formed in and/or through resistor layer 126 and contact layer 122. Each of resistor layer 126 and contact layer 122 may be an insulating layer (e.g., an interlayer dielectric). Wiring layer 108 may be formed on resistor layer 126.

During operation, thermal energy may flow from resistor 124 to BI 112 via thermal grid 104, grid contact 106, wiring layer 108, and BI contact g. Resistor 124 may also be connected to substrate 114 via some or all of thermal grid 104, wiring layer 108, grid contact 106, wiring layer 108, and BI contact 110, and BI 112. BI 112 extends to contact substrate 114. Thermal energy may be dissipated by some or all of thermal grid 104, grid contact 106, and wiring layer 108. Each of thermal grid 104, grid contact 106, and wiring layer 108, BI contact 110, and BI 112 may be electrically connected to substrate 114 and may be conducting, including metals such as tungsten doped poly silicon, amorphous silicon, or other thermally and electrically conductive materials. In one embodiment, thermal grid 104, grid contact 106, wiring layer 108, BI contact 110, and BI 112 may be electrically grounded.

A person skilled in the art will readily recognize that location of one or both of thermal grid 104 and wiring layer 108 in semiconductor structure 102 may be adjusted and modified to meet design and performance needs. Further, it is understood that other structures, elements, and components have been omitted for clarity. The omitted structures may include any conventional interconnect components, passive devices, etc. It is understood that processing generally refers to a portion of the manufacturing process in which individual components and devices are patterned, interconnected, (e.g., via wiring, metallization, etc.), etched, deposited (e.g., deposition of nitride on semiconductor structure 102, etching of replacement gates, etc.), etc.

Substrate 114 and/or resistor 124 may be comprised of but not limited to silicon, germanium, silicon germanium silicon carbide, and those consisting essentially of one or more Group III-V compound semiconductors having a composition defined by the formula $AU_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 114 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). It is further understood that resistor 124 may further be doped to conform resistance values to design specifications and requirements.

As used herein, the term "depositing" may include any conventional techniques now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

As used herein, the term "etching" may include any conventional techniques now known or later developed techniques appropriate for the material to be etched, including, but not limited to, for example: reactive ion etch (RIE). As is known in the art of semiconductor fabrication, RIE uses chemically reactive plasma to remove material deposited on wafers/substrates. Differences in width between these openings may allow for utilizing a phenomenon known as inverse RIE lag. Inverse RIE lag, as is known in the art of semiconductor fabrication, causes a faster etch rate in narrower openings (higher aspect ratios) than in openings having larger widths (lower aspect ratios). Inverse RIE lag may be induced under any conditions characterized by high polymerization and high wafer self-bias voltages. In one embodiment, conditions characterized by high polymerization, may include general chemistries such as CxHyFz (Carbon-Hydrogen-Fluorine) with high oxide-to-nitride selectivity (where the blanket etch rate ratio is greater than approximately 20:1). In another embodiment, conditions characterized by high polymerization may include $O_2$ (oxygen), a dilutant, and one or more of: $C_4F_6$, $C_5F_8$, or $C_4F_8$. In this case, the dilutant may be, for example, Argon (Ar). High wafer self-bias voltages may, for example, be voltages greater than approximately 500 volts. While specific conditions for facilitating inverse RIE lag are described herein, those conditions are merely illustrative. Inverse RIE lag may be induced under other conditions not specifically described herein.

Figure 2:
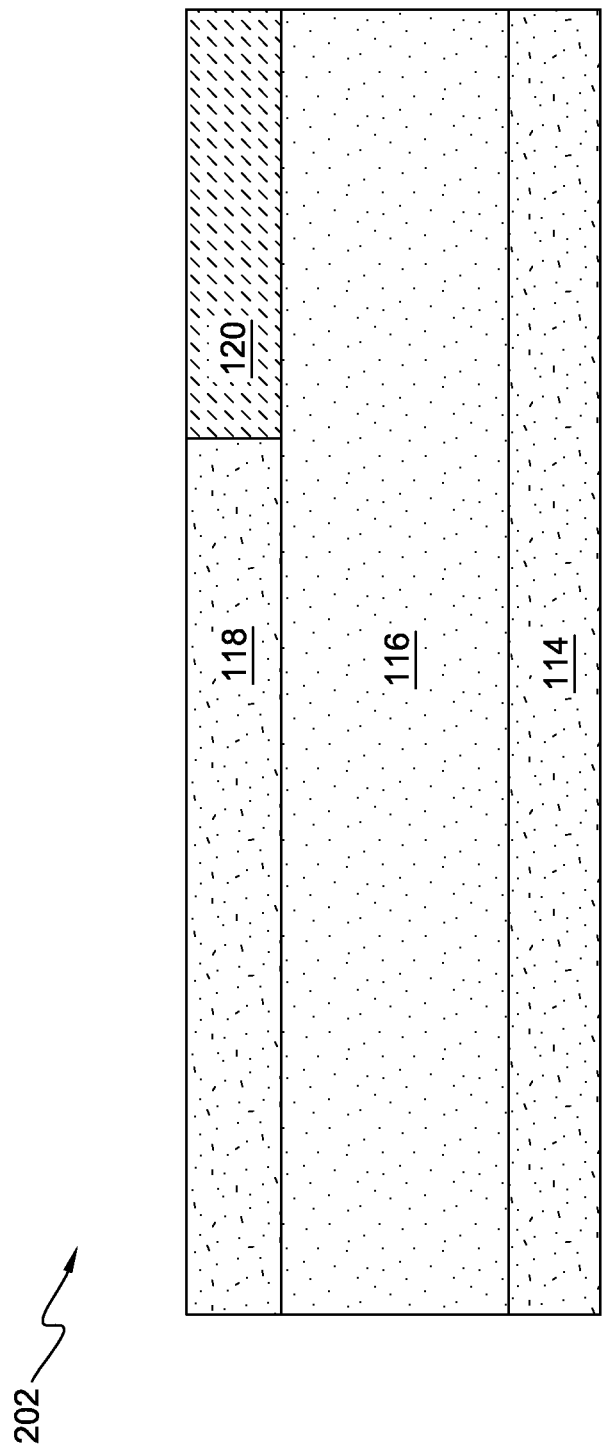
FIGS. 2-14 depict cross-sectional views illustrating a method of forming portions of a semiconductor structure, in accordance with embodiments of the present disclosure.

Turning to FIGS. 2-14, cross-sectional views illustrating a process in forming a semiconductor structure 102 (shown in FIG. 14) with resistor 124 and thermal grid 104 connected to BI 112. FIG. 2 depicts a cross-sectional view illustrating a method of forming portions of a semiconductor structure, in accordance with embodiments of the present disclosure. In particular, FIG. 2 depicts formulation of a layered substrate 202, upon which fabrication processes are to be performed, thereby forming semiconductor structure 102. The fabrication processes may include photoresist techniques, replacement gate processes, deposition, etching or any other conventional techniques. Layered substrate 202 includes substrate 114, buried oxide layer (BOX) 116, and insulation layer 118. In one embodiment, to form layered substrate 202, BOX 116 is formed on substrate 114 using conventional methods, such as CVD. Excess material may be removed from BOX 116 using conventional methods, such as chemical-mechanical planarization. Insulation layer 118 is formed on BOX 116 using conventional methods. During formation of layered substrate 202, shallow trench isolation structure (STI) 120 may be formed in or through layered substrate 202 via one or more of shallow trench isolation and other conventional techniques (e.g., etching, deposition, etc.). In one embodiment, insulation layer 118, BOX 116, insulation layer 118, and STI 120 may each include silicon dioxide ($SiO_2$) for its insulation, mechanical, and optical qualities. In other embodiments, insulation layer 118, BOX 116, insulation layer 118, and STI 120 may each be comprised of, for example, a silicon oxide, sapphire, and/or a hafnium oxide. However, insulation layer 118, BOX 116, insulation layer 118, and STI 120 may each also include, but is not limited to: silicon nitride ($Si_3N_4$), fluorinated $SiO_2$ (FSG), hydrogenated silicon oxycarbide (Si-COH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Insulation layer 118, BOX 116, and insulation layer 118 may be deposited using conventional techniques.

Figure 3:
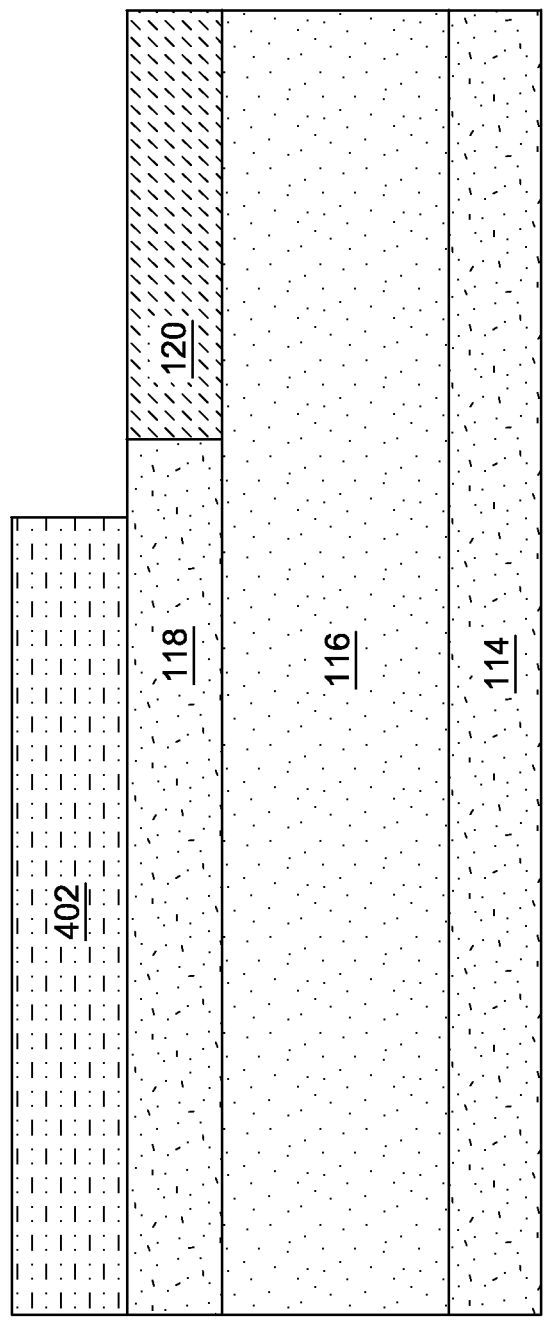

FIG. 3 depicts a cross-sectional view illustrating a method of forming portions of a semiconductor structure, in accordance with embodiments of the present disclosure. In FIG. 3, dummy grid layer 402 may be formed on insulation layer 118 using conventional techniques, including conventional gate deposition techniques. In one embodiment, dummy grid layer 402 is formed as a traditional metal gate. Here, dummy grid layer 402 may include dummy poly, oxides, or other suitable material. For example, dummy grid layer 402 may include polycrystalline silicon. In an embodiment, dummy grid layer 402 can include any number and/or configuration of dummy grids formed on layered substrate 202.

Figure 4:
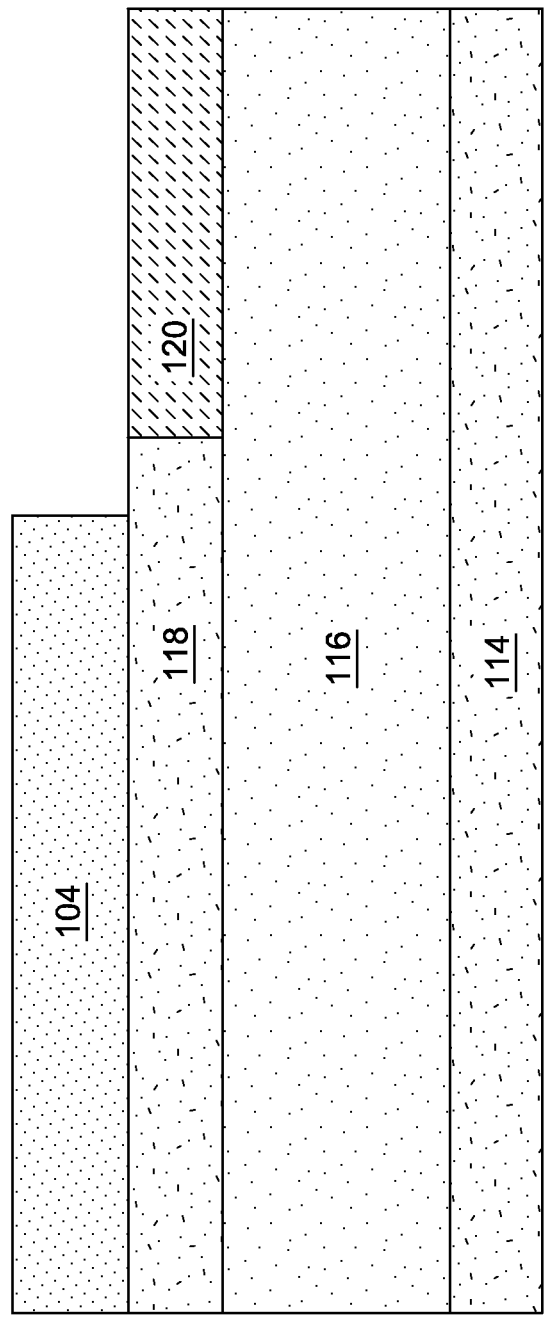

FIG. 4 depicts a cross-sectional view illustrating a method of forming portions of a semiconductor structure, in accordance with embodiments of the present disclosure. In FIG. 4, thermal grid 104 is formed on insulator layer 118 using conventional techniques, such as conventional gate deposition techniques. In one embodiment, thermal grid 104 includes metals or other thermally conductive materials. In another embodiment, thermal grid 104 may be formed on insulator layer 118 as a traditional metal gate. Here, thermal grid 104 may include poly, oxides, or other suitable material. For example, thermal grid 104 may include polycrystalline silicon.

Figure 5:
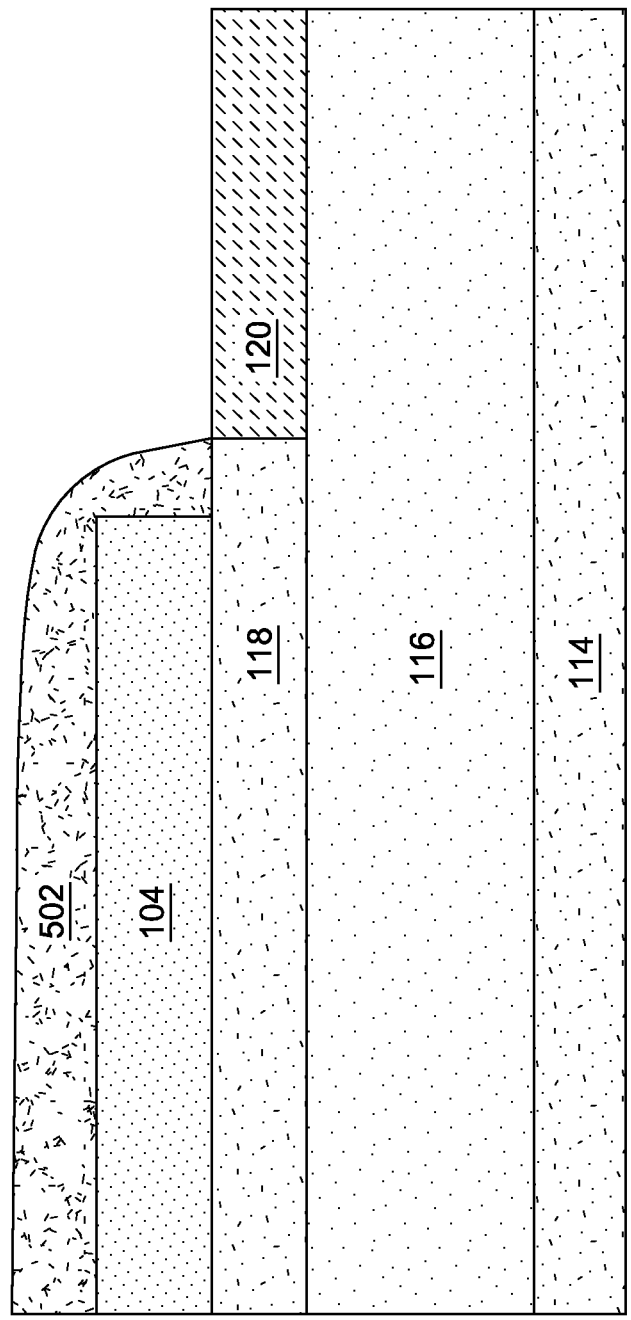

FIG. 5 depicts a cross-sectional view illustrating a method of forming portions of a semiconductor structure, in accordance with embodiments of the present disclosure. In FIG. 5, dummy resistor layer 502 is formed over layered substrate 202 and thermal grid 104. Dummy resistor layer 502 may be formed using conventional techniques, such as deposition of silicon, silicate, metal or any other known or later developed materials, using PVD, CVD, etc. Dummy resistor layer 502 may include dummy poly, oxides, or other suitable material. For example, dummy resistor layer 502 may include polycrystalline silicon. Dummy resistor layer 502 may substantially cover thermal grid 104. Dummy resistor layer 502 may at least partially cover one or both of insulator 118 and STI 120.

Figure 6:
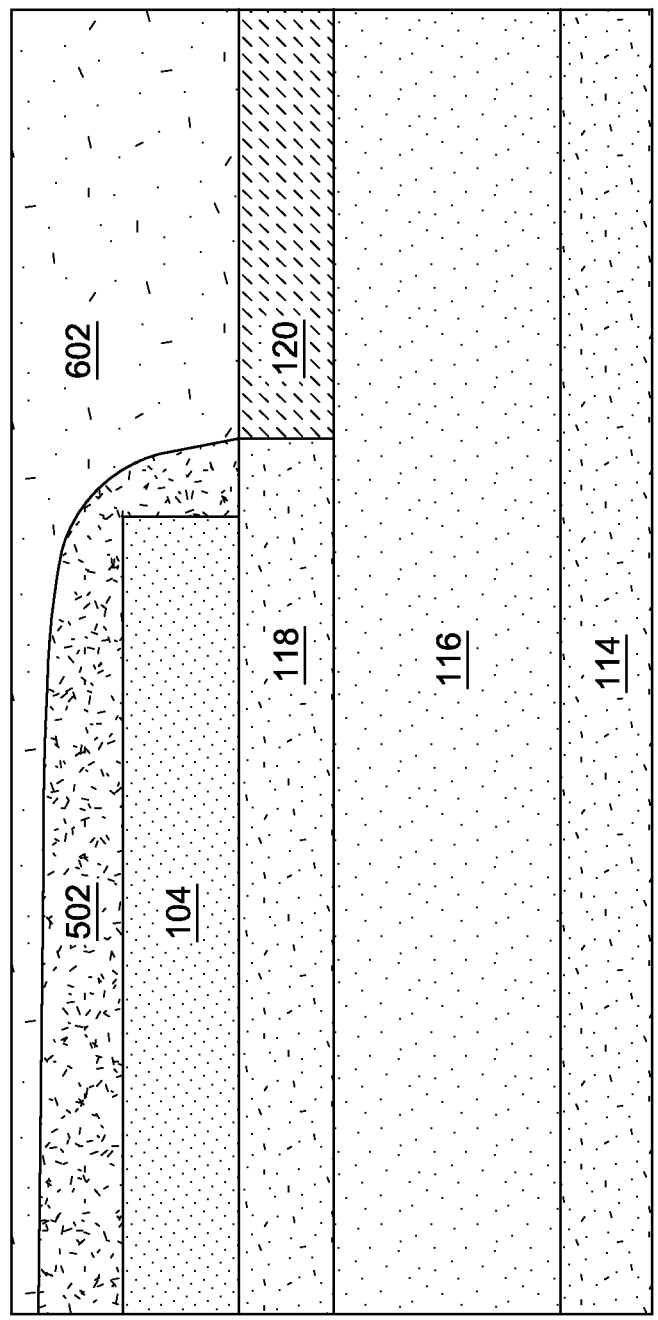

FIG. 6 depicts a cross-sectional view illustrating a method of forming portions of a semiconductor structure, in accordance with embodiments of the present disclosure. In FIG. 6, dummy BI layer 602 is formed over STI 120. Dummy BI layer 602 may also cover, at least partially, one or both of dummy resistor layer 502 and insulator 118. Dummy BI layer 602 may be formed using conventional techniques. Dummy BI layer 602 may include dummy poly, oxides, or other suitable material. For example, dummy BI layer 602 may include polycrystalline silicon. Dummy BI layer 602 may substantially cover dummy resistor layer 502. In some embodiments, dummy resistor layer 502 and dummy BI layer 602 comprise different materials relative to one another. For example, the materials may have different etch rates or different susceptibility to particular etch techniques. In some embodiments, dummy resistor layer 502 and dummy BI layer 602 may comprise a single layer. In one such embodiment, each of dummy resistor layer 502 and dummy BI layer 602 may comprise the same material as one another.

Figure 7:
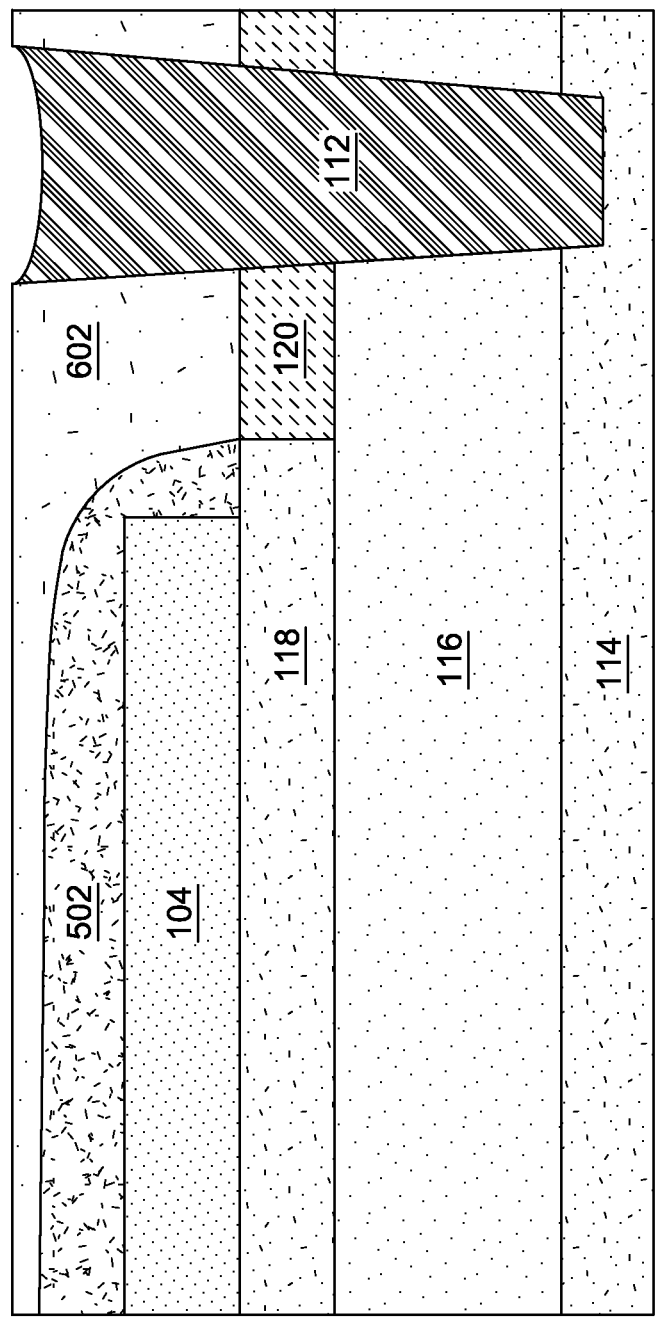

FIG. 7 depicts a cross-sectional view illustrating a method of forming portions of a semiconductor structure, in accordance with embodiments of the present disclosure. In FIG. 7, BI 112 may be formed in or through dummy BI layer 602 and layered substrate 202. In one embodiment, BI 112 may be formed via conventional techniques (e.g., etching, deposition, etc.). For example, BI 112 may be formed via RIE. Alternatively, BI 112 may be drilled, bored, or otherwise formed through and/or into dummy BI layer 602, STI 120, BOX 116, and substrate 114. BI 112 may be thermally conductive. For example, BI 112 may include metals or other thermally conductive materials. In one embodiment, as shown in FIG. 1, BI 112 may receive thermal energy from BI contact 110. In another embodiment, BI 112 may conduct thermal energy with substrate 114.

Figure 8:
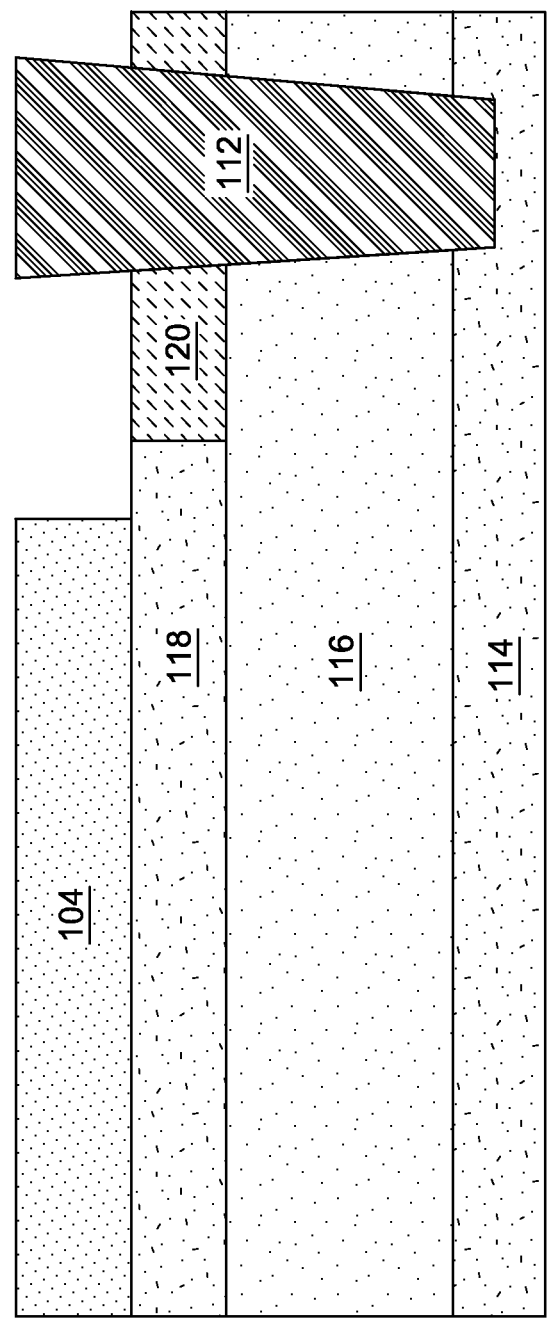

FIG. 8 depicts a cross-sectional view illustrating a method of forming portions of a semiconductor structure, in accordance with embodiments of the present disclosure. In FIG. 8, BI 112 is planarized to about a surface of BI 112. In one embodiment, BI 112 may be planarized to about a surface of thermal grid 104. In one embodiment, one or both of dummy resistor layer 502 and dummy BI layer 602 may also be planarized to about a surface of BI 112, for example. Planarization may include conventional planarization techniques, such as chemical mechanical polishing. In one embodiment, planarization of BI 112 exposes a surface of BI 112. Dummy resistor layer 502 (not shown in FIG. 8) and dummy BI layer 602 (not shown in FIG. 8) are removed via conventional techniques (e.g., etching).

Figure 9:
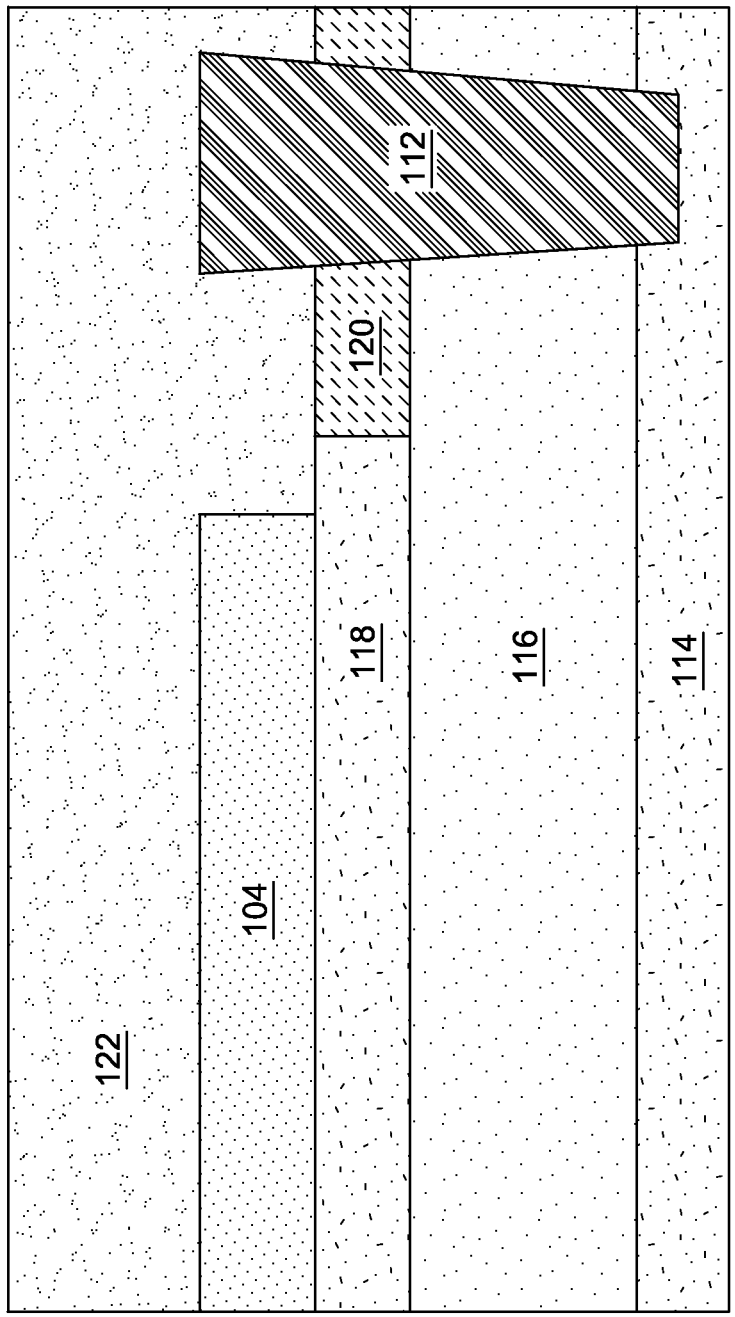

FIG. 9 depicts a cross-sectional view illustrating a method of forming portions of a semiconductor structure, in accordance with embodiments of the present disclosure. In FIG. 9, contact layer 122 is formed over layered substrate 202, thermal grid 104, and BI 112. Contact layer 122 may be formed using conventional techniques, such as deposition of silicon, silicate, metal or any other known or later developed materials using PVD, CVD, etc. Contact layer 122 may substantially cover layered substrate 202, thermal grid 104, and BI 112. In one embodiment, resistor layer 126 comprises a dielectric.

Figure 10:
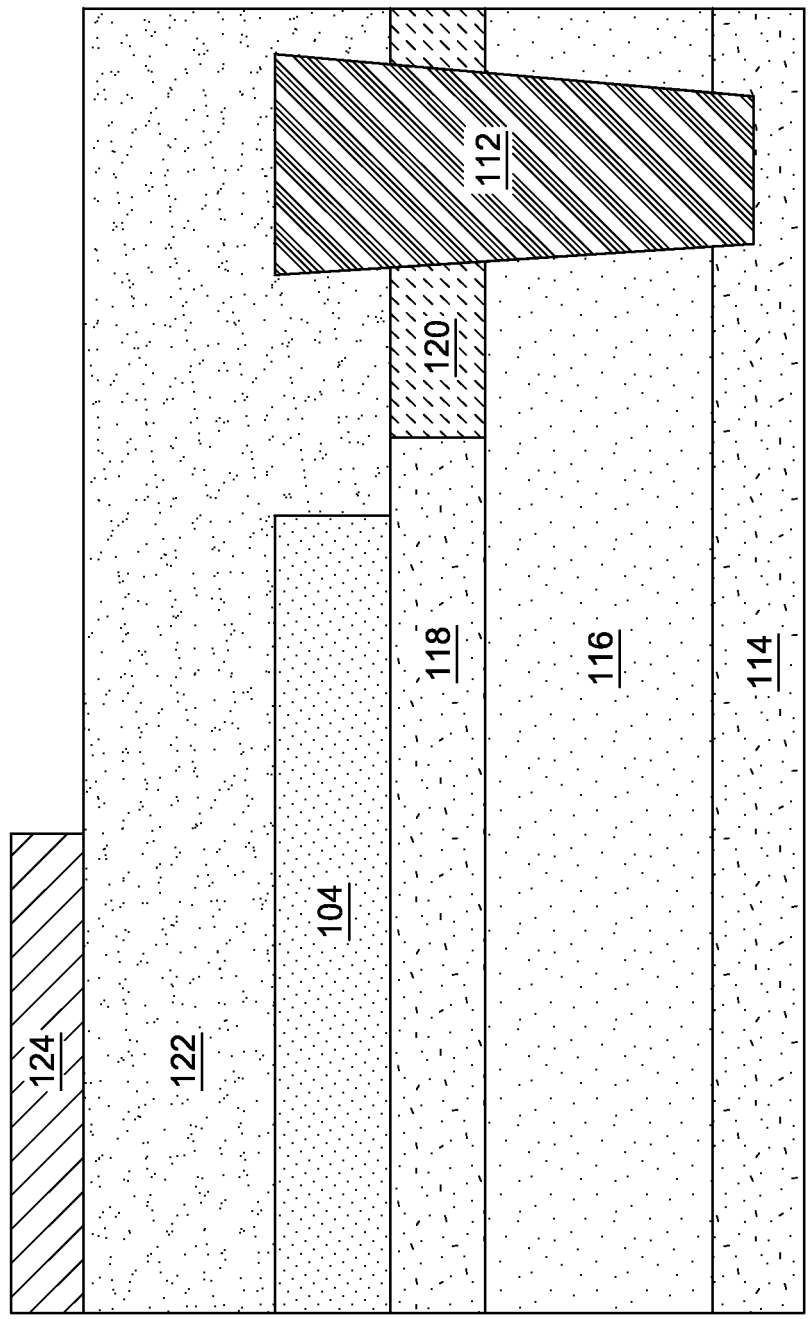

FIG. 10 depicts a cross-sectional view illustrating a method of forming portions of a semiconductor structure, in accordance with embodiments of the present disclosure. In FIG. 10, resistor 124 is formed on contact layer 122. Resistor 124 may be formed on contact layer 122 using conventional techniques. Resistor 124 may be comprised of various materials, as discussed in more detail herein.

Figure 11:
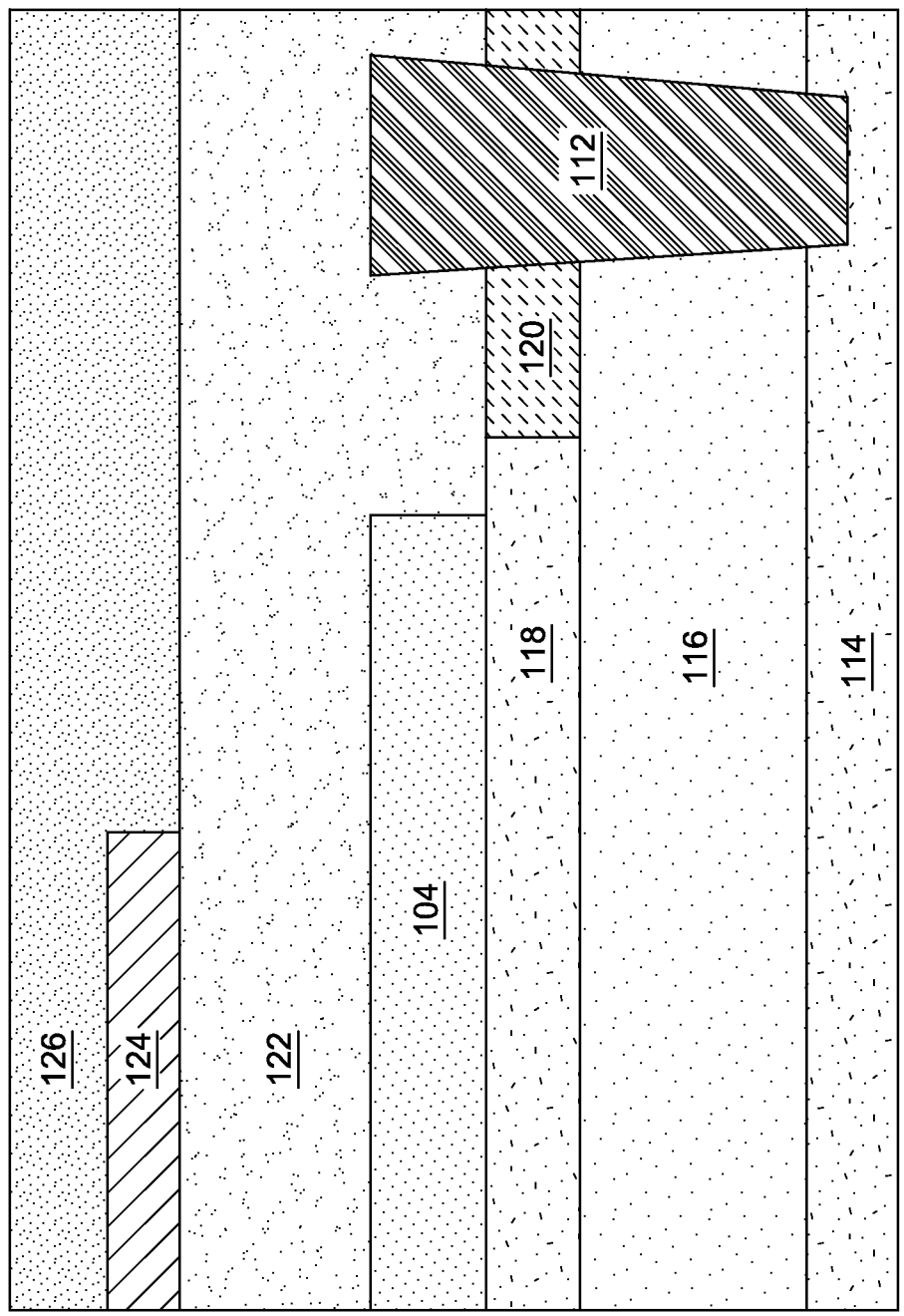

FIG. 11 depicts a cross-sectional view illustrating a method of forming portions of a semiconductor structure, in accordance with embodiments of the present disclosure. In FIG. 11, resistor layer 126 is formed over contact layer 122 and resistor 124. Resistor layer 126 may be formed using conventional techniques. Resistor layer 126 may substantially cover resistor 124 and contact layer 122. In one embodiment, resistor layer 126 comprises a dielectric.

Figure 12:
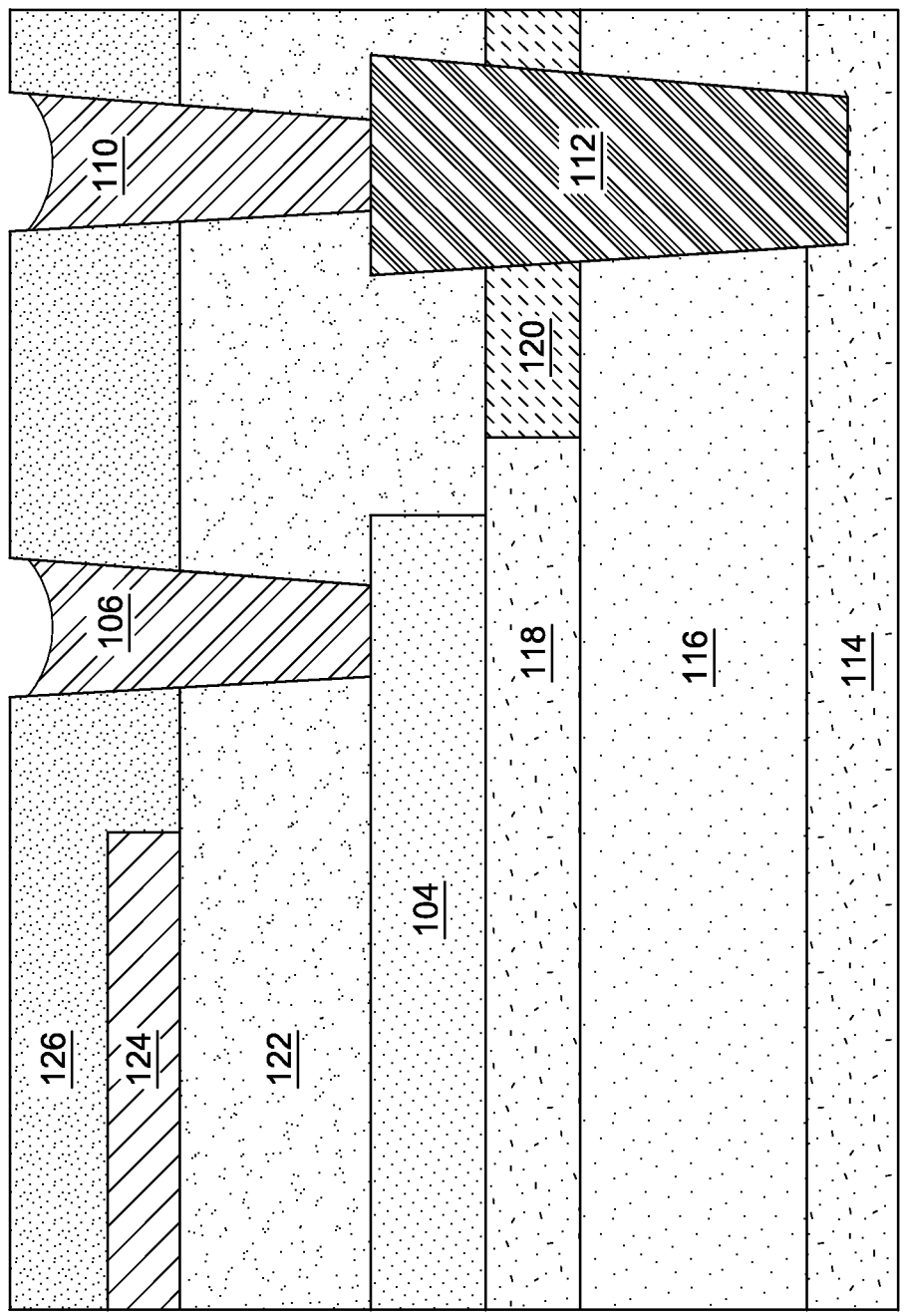

FIG. 12 depicts a cross-sectional view illustrating a method of forming portions of a semiconductor structure, in accordance with embodiments of the present disclosure. In FIG. 12, grid contact 106 and BI contact 110 may each be formed in or through resistor layer 126 and contact layer 122. In one embodiment, grid contact 106 and BI contact 110 may each be formed via conventional techniques (e.g., etching, deposition, etc.). For example, BI 112 may be formed via RIE. Alternatively, grid contact 106 and BI contact 110 may each be drilled, bored, or otherwise formed through and/or into resistor layer 126 and contact layer 122. Grid contact 106 and BI contact 110 may each be thermally conductive. For example, grid contact 106 and BI contact 110 may each include metals or other thermally conductive materials. In one embodiment, as shown in FIG. 1, grid contact 106 may receive thermal energy from one or both of thermal grid 104 and resistor 124. Grid contact 106 may further be adapted to conduct thermal energy to BI 112 via wiring layer 108 and BI contact 110.

Figure 13:
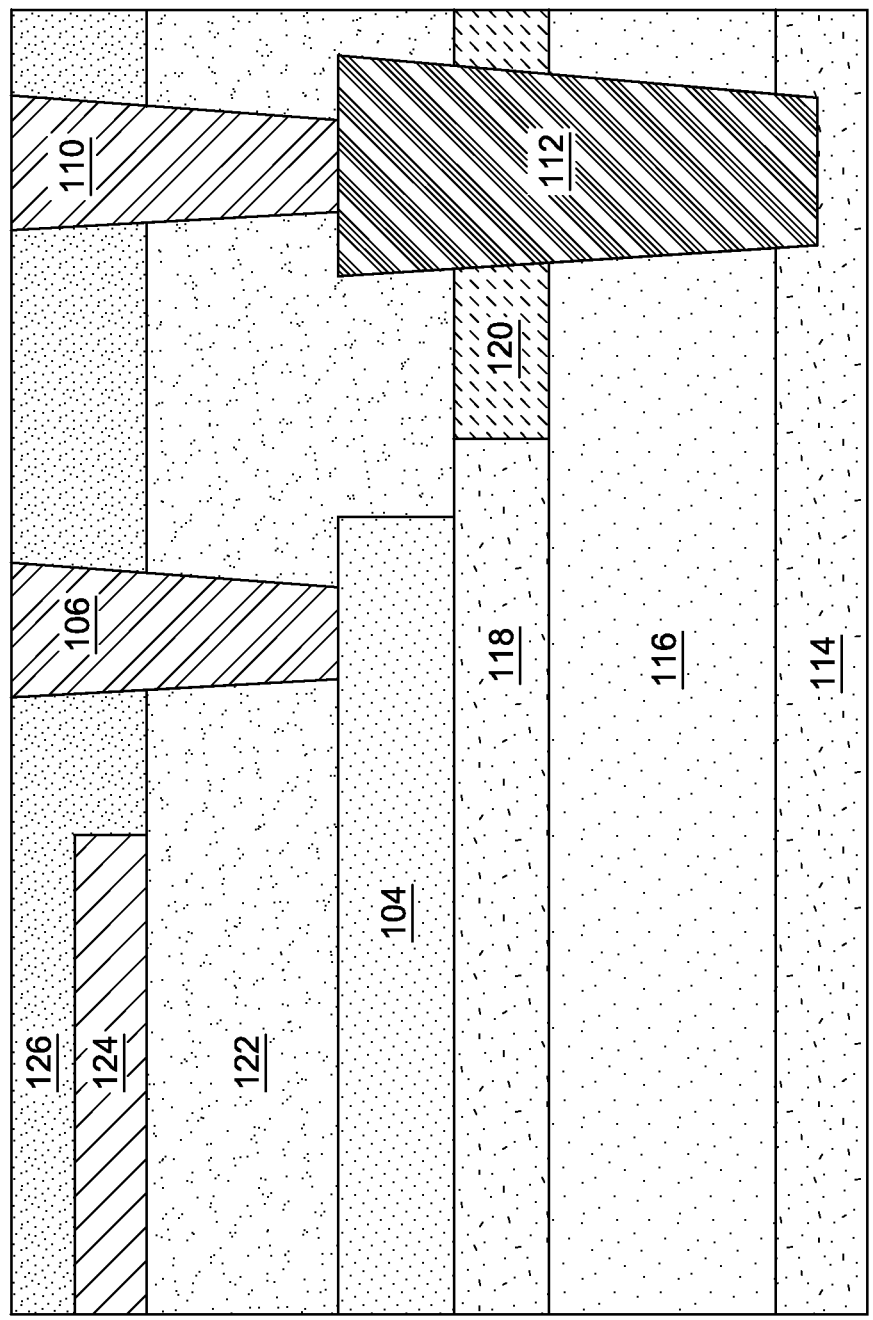

FIG. 13 depicts a cross-sectional view illustrating a method of forming portions of a semiconductor structure, in accordance with embodiments of the present disclosure. As seen in FIG. 13, resistor layer 126, grid contact 106, and BI contact 110 are each planarized to about a surface of grid contact 106 and BI contact 110 using conventional techniques. In one embodiment, planarization of resistor layer 126 exposes a surface of each of grid contact 106 and BI contact 110.

Figure 14:
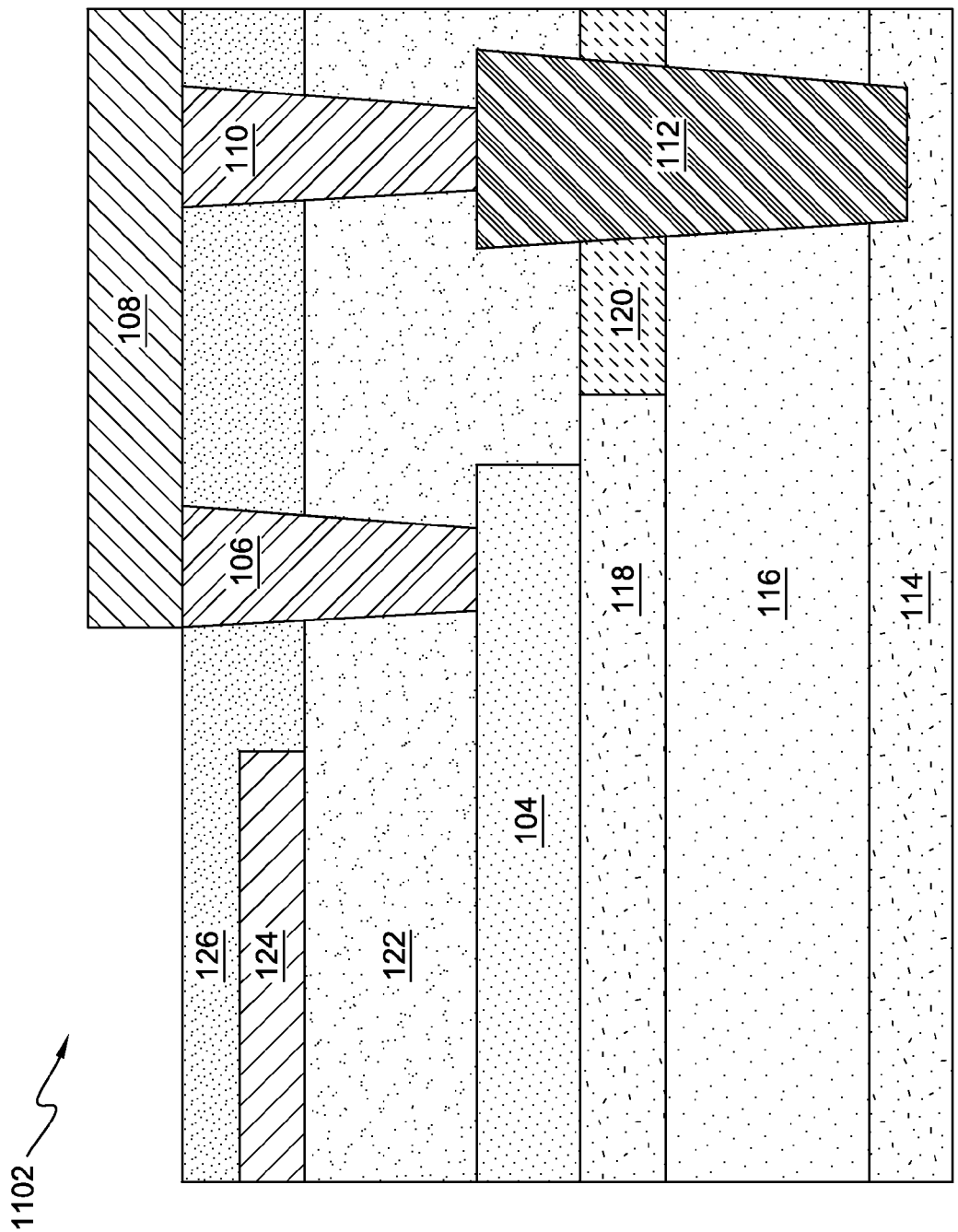

FIG. 14 depicts a cross-sectional view illustrating a method of forming portions of a semiconductor structure, in accordance with embodiments of the present disclosure. In FIG. 14, wiring layer 108 is formed on resistor layer 126. In one embodiment, wiring layer 108 contacts a surface of each of grid contact 106 and BI contact 110. Wiring layer 108 may connect grid contact 106 and BI contact 110 by, for example, a thermal connection. Wiring layer 108 may be thermally conductive. For example, wiring layer 108 may each include metals or other thermally conductive materials. In one embodiment, as shown in FIG. 1, wiring layer 108 may receive thermal energy from one or both of grid contact 106 and BI contact 110. In another embodiment, wiring layer 108 may receive thermal energy from one or more of grid contact 106, BI contact 110, and resistor 124. For example, wiring layer 108 may be formed on resistor layer 126 such that wiring layer 108 is proximate to resistor 124 and contacts a surface of one or both of grid contact 106 and BI contact 110.

Figure 15:
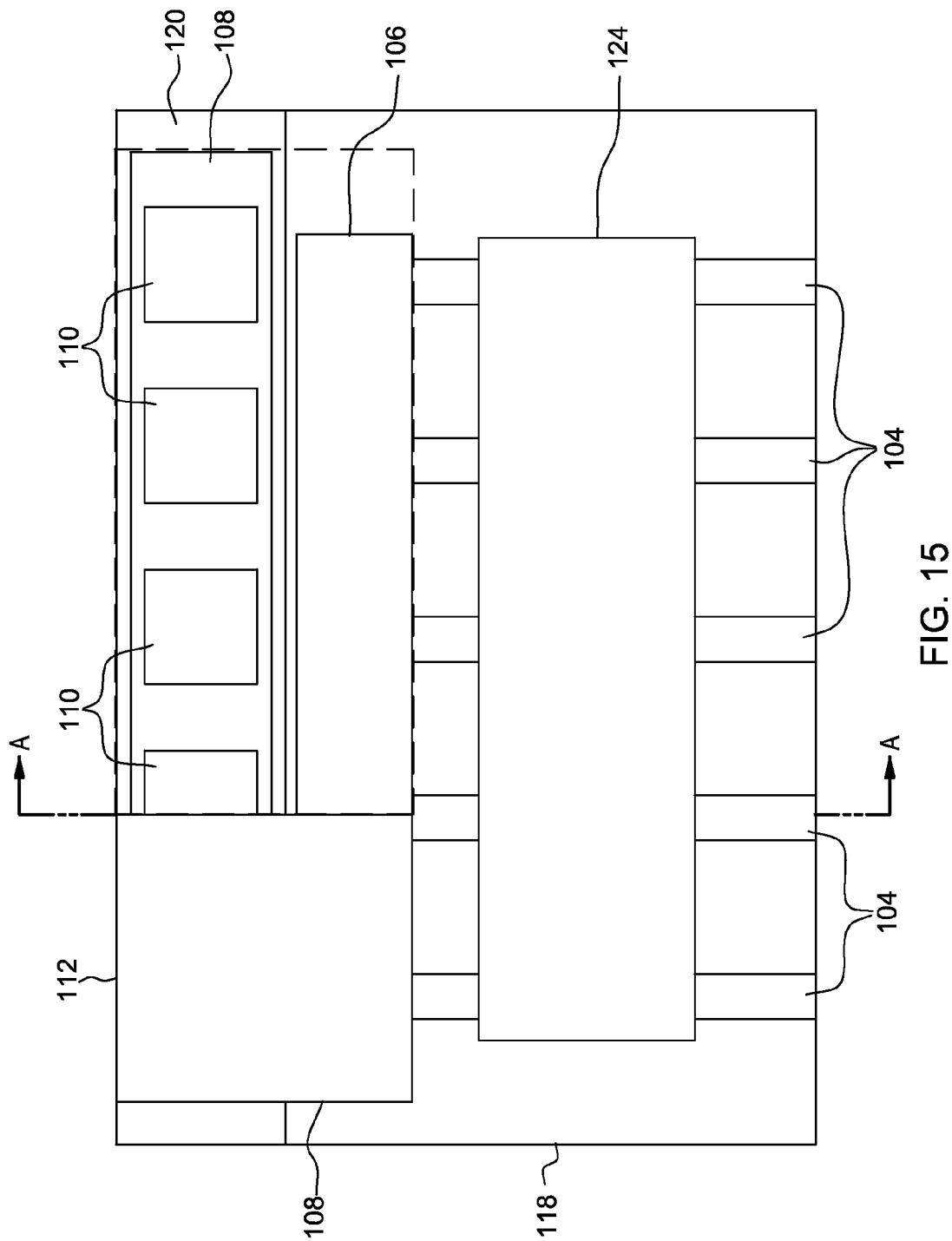
FIG. 15 depicts a cross-sectional top view of portions of a semiconductor structure, in accordance with an embodiment of the present disclosure.

FIG. 15 depicts a cross-sectional top view of portions of a semiconductor structure, in accordance with an embodiment of the present disclosure. In this embodiment, resistor 124 is thermally connected to BI 112 via thermal grid 104, grid contact 106, wiring layer 108, and BI contact 110. Thermal grid 104 includes one or more metals and is disposed between insulator 118 and resistor 124. Thermal grid 104 may be arranged over all or part of insulator 118. Thermal grid 104 may be arranged under all or part of resistor 124. As depicted in FIG. 15, thermal grid 104 may include a plurality of lines of thermally conductive material arranged over portions of insulator 118 and under portions of resistor 124. In various embodiments, the lines of thermal grid 104 may be parallel, perpendicular, or of any other orientation with respect to one another. In some embodiments, the lines of thermal grid 104 may form a lattice.

In the embodiment depicted by FIG. 15, wiring layer 108 connects grid contact 106 and BI contact 110. In order to depict components disposed at a layer below wiring layer 108, a portion of wiring layer 108 is omitted from FIG. 15, as indicated by a dotted outline. Wiring layer 108 may include metals and may conduct thermal gradients about semiconductor structure 1502, connecting a plurality of grid contacts 106 and BI contacts 110 such that BI 112 and/or substrate 114 may receive thermal energy from resistor 124 and portions of semiconductor structure 1502. Grid contacts 106 and BI contacts 110 are formed in and/or through contact layer 122 (not shown in FIG. 15) and resistor layer 126 (not shown in FIG. 15). BI 112 is formed in and/or through contact layer 122 (not shown in FIG. 15), STI 120, BOX 116 (not shown in FIG. 15), and substrate 114 (not shown in FIG. 15). In one embodiment, BI contact 110 contacts BI 112, which extends to contact substrate 114, thereby being capable of dissipating thermal energy to substrate 114. It is understood that semiconductor structure 1502 is merely an example of a form of IC device that may be formed. In particular, thermal grid 104 may include any number of lines, and each of resistor 124, grid contact 106, wiring layer 108, BI contact 110, and BI 112 may represent any number of respective components. Further, the number of each component depicted in FIG. 15 may be implemented in any proportion relative to one another.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
    a substrate;
    a thermal grid over at least a portion of the substrate and within a first insulating layer;
    a resistor over at least a portion of the thermal grid and disposed on an upper surface of a portion of the first insulating layer; and
    a buried interconnect connected to the thermal grid by a pair of contacts, the buried interconnect being planarized to about a surface of the thermal grid within the first insulating layer,
    wherein the pair of contacts extend at least partially within the first insulating layer and include a first contact connecting the thermal grid to a thermally conductive layer and a second contact connecting the buried interconnect to the thermally conductive layer.

2. The semiconductor structure of claim 1, wherein the resistor is on the upper surface of the portion of the first insulating layer such that the first insulating layer is disposed at least partially between the resistor and the thermal grid.

3. The semiconductor structure of claim 1, further comprising:
    a second insulating layer over at least a portion of the resistor,
    wherein the thermally conductive layer is disposed over at least a portion of the second insulating layer.

4. The semiconductor structure of claim 1, wherein the thermal grid is adapted to receive thermal energy from the resistor.

5. The semiconductor structure of claim 1, wherein the first contact is disposed at least partially within the second insulating layer, and wherein the first contact is adapted to receive thermal energy from the thermal grid.

6. The semiconductor structure of claim 1, wherein the second contact is disposed at least partially within the second insulating layer, and wherein the second contact is adapted to receive thermal energy from the thermal grid.

7. The semiconductor structure of claim 1, wherein the buried interconnect is adapted to receive thermal energy from the thermal grid via the second contact, the thermally conductive layer, and the first contact.

8. The semiconductor structure of claim 1, wherein the buried interconnect at least partially within the substrate.

9. The semiconductor structure of claim 1, wherein the second contact is adapted to receive thermal energy from the first contact via the thermally conductive layer.

10. A method, comprising:
    forming a thermal grid over at least a portion of a substrate within a first insulating layer;
    forming a resistor over at least a portion of the thermal grid and on an upper surface of a portion of the first insulating layer;
    forming a buried interconnect within the first insulating layer substantially adjacent to the thermal grid;
    planarizing the buried interconnect to about a surface of the thermal grid; and
    forming a pair of contacts extending at least partially within the first insulating layer and including a first contact connecting the thermal grid to a thermally conductive layer and a second contact connecting the buried interconnect to the thermally conductive layer.

11. The method of claim 10, wherein forming the resistor further comprises:
   forming the resistor on the upper surface of the portion of the first insulating layer such that the first insulating layer is disposed at least partially between the resistor and the thermal grid.

12. The method of claim 10, further comprising:
forming a second insulating layer over at least a portion of the resistor; and
   forming the thermally conductive layer over at least a portion of the second insulating layer.

13. The method of claim 10, wherein the thermal grid is adapted to receive thermal energy from the resistor.

14. The method of claim 10, further comprising:
   forming the first contact at least partially within the second insulating layer, wherein the first contact is adapted to receive thermal energy from the thermal grid.

15. The method of claim 10, further comprising:
   forming a second contact at least partially within the second insulating layer, wherein the second contact is adapted to receive thermal energy from the thermal grid.

16. The method of claim 10, wherein the buried interconnect is adapted to receive thermal energy from the thermal grid via the second contact, the thermally conductive layer, and the first contact.

17. The method of claim 10, further comprising:
forming the buried interconnect at least partially within the substrate.

18. The method of claim 10, further comprising:
   forming the second contact adapted to receive thermal energy from the first contact via a thermally conductive layer.

* * * * *